(12) United States Patent
Fujioka et al.

(10) Patent No.: US 6,223,684 B1
(45) Date of Patent: May 1, 2001

(54) FILM DEPOSITION APPARATUS

(75) Inventors: Yasushi Fujioka, Soraku-gun; Masahiro Kanai, Tokyo; Yasuyoshi Takai, Nara, all of (JP)

(73) Assignee: Canon Kabushiki Kaisha

( * ) Notice: Subject to any disclaimer, the term of this patent is extended or adjusted under 35 U.S.C. 154(b) by 0 days.

(21) Appl. No.: 09/110,124

(22) Filed: Jul. 6, 1998

(30) Foreign Application Priority Data

Jul. 7, 1997 (JP) .................................................. 9-196585
Jun. 30, 1998 (JP) ................................................ 10-199869

(51) Int. Cl.[7] ............................ C23C 16/00; C23C 16/513
(52) U.S. Cl. ................... 118/723 R; 118/723 E; 118/715; 156/345
(58) Field of Search ...................... 118/723 R, 723 E, 118/715; 156/345

(56) References Cited

U.S. PATENT DOCUMENTS

| | | | |
|---|---|---|---|
| 4,400,409 | 8/1983 | Izu et al. ............................... | 427/39 |
| 5,112,185 * | 5/1992 | Koike .................................... | 118/715 |
| 5,584,973 * | 12/1996 | Wada et al. ...................... | 204/192.13 |
| 5,804,046 * | 9/1998 | Sawada et al. .................. | 204/298.11 |
| 5,827,370 * | 10/1998 | Gu ........................................ | 118/715 |
| 5,928,426 * | 7/1999 | Aitchison ............................. | 118/715 |

FOREIGN PATENT DOCUMENTS

| | | |
|---|---|---|
| 60-114570 | 6/1985 | (JP) . |
| 1-312833 | 12/1989 | (JP) . |
| 4-136175 | 5/1992 | (JP) . |
| 8-133899 | 5/1996 | (JP) . |
| 8-299784 | 11/1996 | (JP) . |

* cited by examiner

Primary Examiner—Jeffrie R. Lund
Assistant Examiner—Sylvia R. MacArthur
(74) Attorney, Agent, or Firm—Fitzpatrick, Cella, Harper & Scinto

(57) ABSTRACT

A film deposition apparatus includes a vacuum chamber, a gas supplier, a gas exhauster, and a discharging means, the film deposition apparatus forming a deposited film on a substrate provided in the vacuum chamber by a plasma enhanced CVD process, wherein at least one louver is provided at the interior and/or vicinity of the plasma discharging space in the vacuum chamber.

6 Claims, 14 Drawing Sheets

FIG. I

FIG. 4
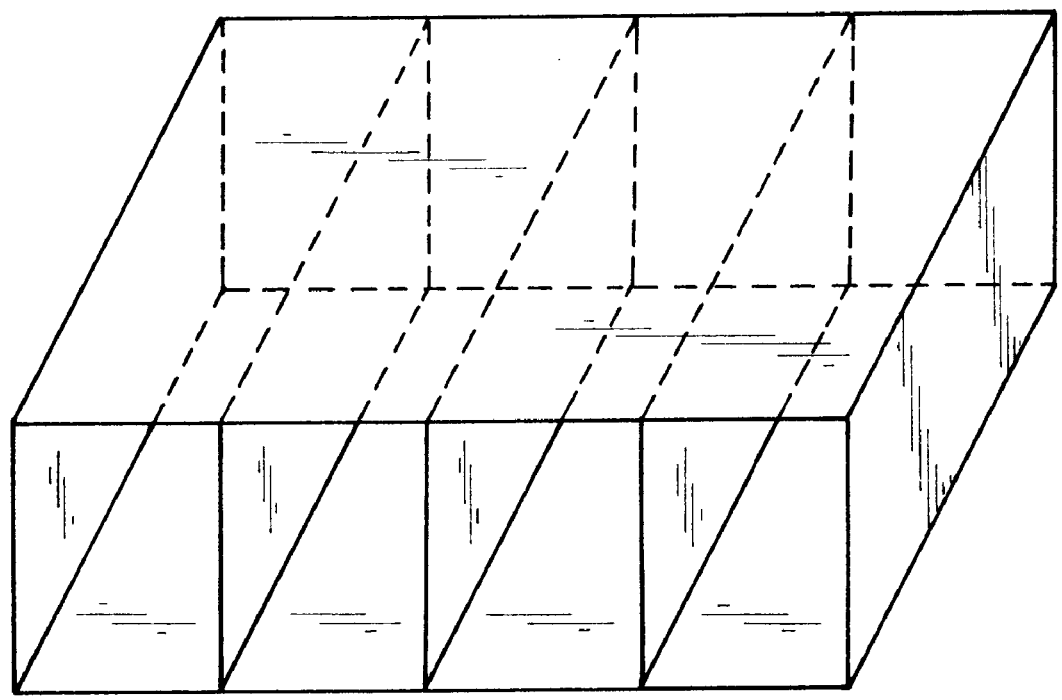
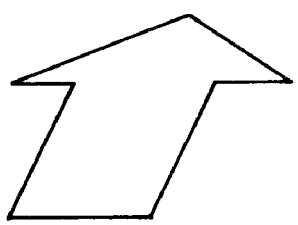

FIG. 5
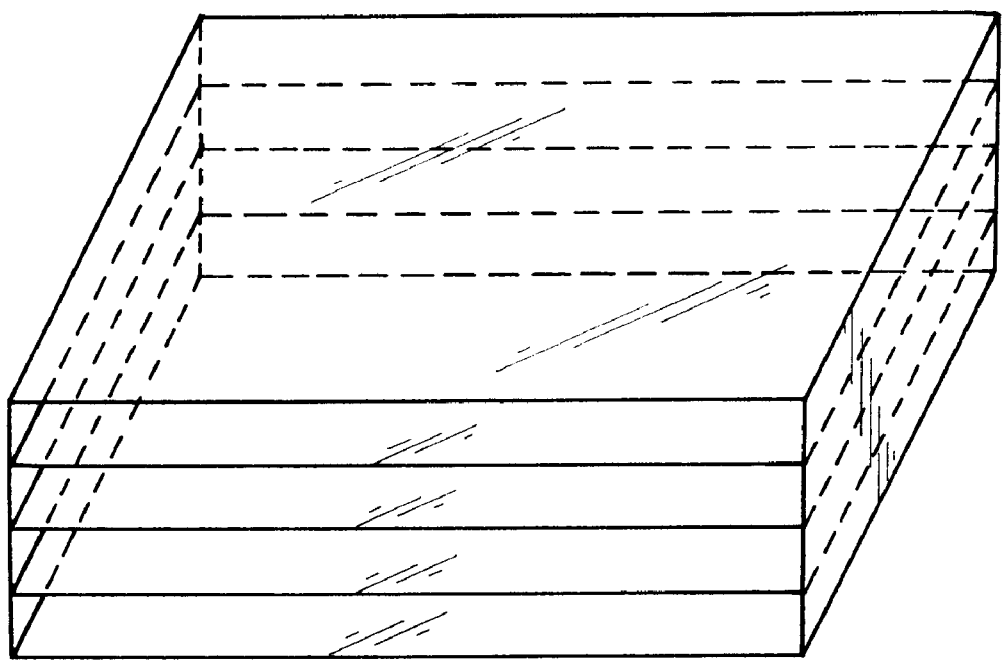
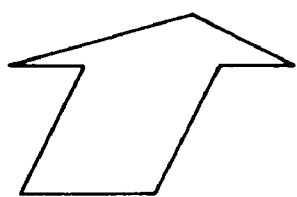

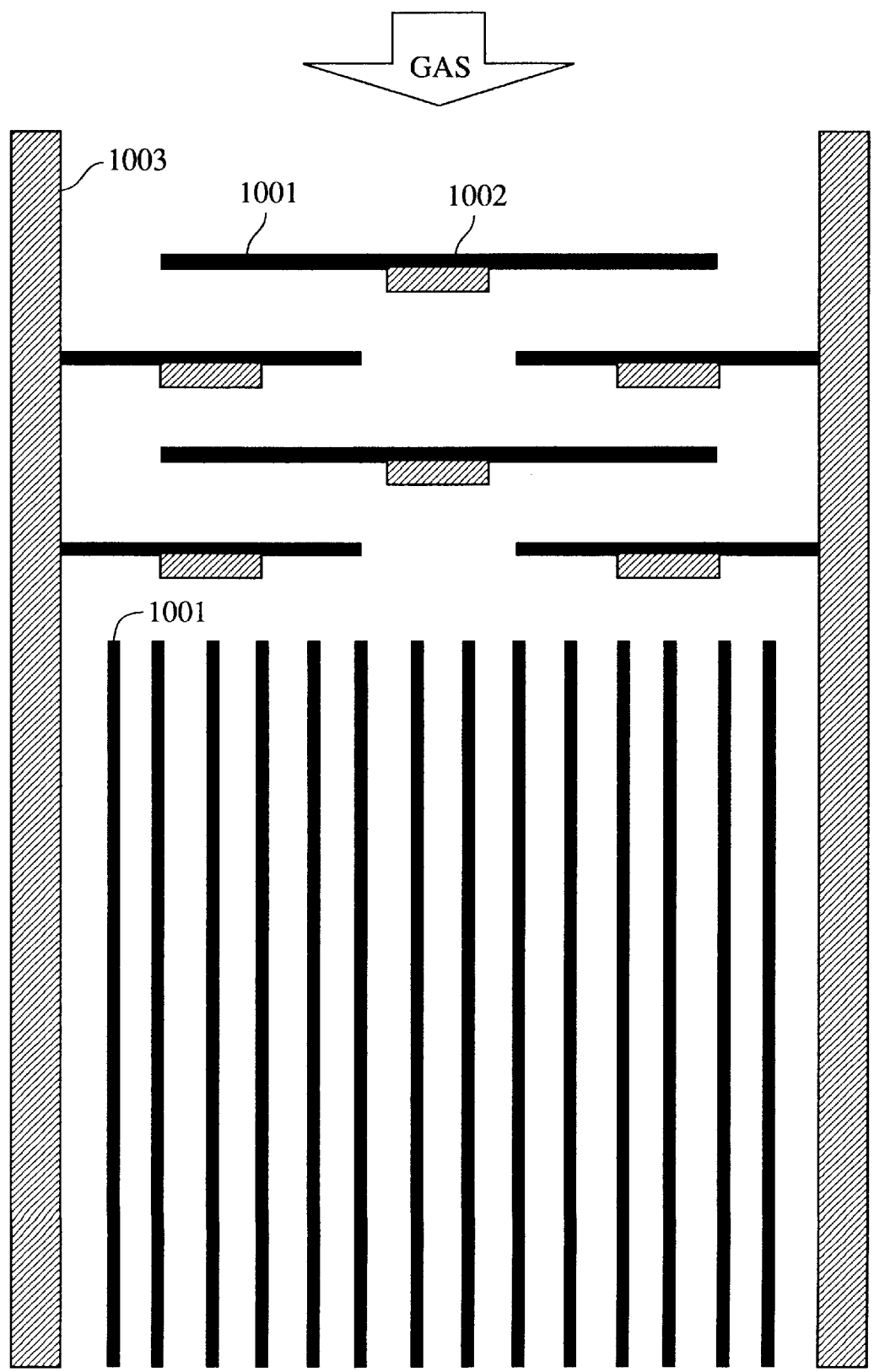

FIG. IIA
FIG. IIB
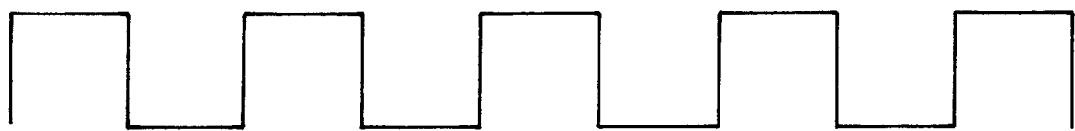
FIG. IIC

FILM DEPOSITION APPARATUS

BACKGROUND OF THE INVENTION

1. Field of the Invention

The present invention relates to a film deposition apparatus by a plasma enhanced CVD process.

2. Description of the Related Art

A plasma enhanced CVD process has been known as a method for forming a deposited film on a substrate. In the plasma enhanced CVD process, a gas supplier, a gas exhauster, and a plasma generator are provided in a vacuum chamber, and a deposited film is formed on a substrate placed into the vacuum chamber by means of plasma generated from material gases. For example, material gases, such as $SiH_4$ and $Si_2H_6$ are supplied into the vacuum chamber, and an RF- or microwave-discharging electrical power is applied to generate plasma in the vacuum chamber while evacuating to keep a constant pressure. An amorphous silicon semiconductor film is thereby formed on the substrate surface in the vacuum chamber.

Conventional plasma apparatuses produce particles or powder as by-products in the formation step of the deposited film, these particles deposit in the vacuum chamber, and in particular, near the vent of the exhauster. Adhesion of such particles on the substrate surface deteriorates the characteristics of the deposited film and causes formation of defects such as pinholes, resulting in a decreased yield of products using the deposited films. For example, an amorphous silicon solar battery produced by a plasma enhanced CVD process requires a semiconductor device with a significantly large area; however, if particles are present in the amorphous silicon deposited film, the resulting solar battery device will have defects such as short-circuiting, because the amorphous silicon film has a significantly low thickness of less than approximately 500 nm and a layered structure of pin, p-i-n, p-i-n-p-i-n or p-i-n-p-i-n-p-i-n.

U.S. Pat. No. 4,400,409 discloses a continuous plasma enhanced CVD apparatus using a roll-to-roll system for continuously producing amorphous silicon semiconductor devices. The CVD apparatus is provided with a plurality of plasma enhanced CVD chambers that are arranged along a path so that a strip of long substrate with a desired width continuously travels in these plasma enhanced CVD chambers. Required conductive-type semiconductor films are separately deposited in these plasma enhanced CVD chambers while transferring the substrates along the path. Devices that have semiconductor junctions and a large area are thereby continuously formed. Consequently, the roll-to-roll-type continuous plasma enhanced CVD apparatus can continuously produce devices for a long time with high productivity.

On the other hand, such continuous film deposition causes ready accumulation of particles in the plasma enhanced CVD chambers under certain conditions. Since accumulated particles increase with the production time, the resulting devices will have defects. Further, evacuating systems for evacuating the plasma enhanced CVD chambers will malfunction because of clogging by the particles, resulting in a decreased operation rate.

Several methods for suppressing adhesion of the particles are disclosed in, for example, Japanese Patent Laid-Open Nos. 60-114570, 1-312833, 4-136175, 8-133899, and 8-299784.

In the method disclosed in Japanese Patent Laid-Open No. 60-114570, exhaust pipes and trapped particles or powder are heated so that the trapped powder is converted into high-density, hard, fine powder which is easily collected.

In the method disclosed in Japanese Patent Laid-Open No. 1-312833, a second reaction chamber and a second heating means are provided between the hermetic chambers and the evacuation systems so as to completely decompose gas which is not pyrolyzed in the first reaction chamber.

The thin film deposition apparatus disclosed in Japanese Patent Laid-Open No. 4-136175 is provided with reaction chambers for depositing films by the reaction of the unreacted gas in the exhaust gas so as to decrease untreated gas in the exhaust pipes, in order to prevent the formation of dust, such as powder or film fragments, and to prevent deterioration of vacuum pumps and toxic gas treating units.

In the technology disclosed in Japanese Patent Laid-Open No. 8-133899, films are deposited while heating exhaust pipes that pass through the interiors of substrate heaters.

In the technology disclosed in Japanese Patent Laid-Open No. 8-299784, a heating trap composed of a baffle-plate is provided in a passage container which intervenes in the midway of each evacuation path in order to decompose and substantially trap the unreacted gas in the exhaust gas.

These technologies are capable of effectively collecting or disposing unreacted gas in the exhaust pipes, powder formed by the reaction of the unreacted gas, and film fragments, and of solving the considerable problems caused by the unreacted gas, powder, and film fragments.

These conventional plasma enhanced CVD technologies have been developed to solve problems occurring in the exhaust pipes, and thus do not suggest problems occurring at the interior and/or vicinity of the plasma discharging space. That is, the conventional technologies suppress problems in the evacuation systems, such as decreased evacuation efficiency and deteriorated pump oil, caused by unreacted gas in the exhaust pipes, and contamination of substrates and deposited films caused by backflow of powder formed in the exhaust pipes into reaction chambers. Thus, in the continuous film deposition by a roll-to-roll process, problems caused by particles or powder deposited on the plasma enhanced CVD chambers still remain.

Particles or powder may deposit on places other than the exhaust pipes, for example, inner walls of the reaction chambers which form plasma discharging spaces, and particularly near the discharging spaces and the exhaust pipes. The deposited particles will spontaneously drop or be scattered by a gas stream or a backflow from the evacuation system during a lengthy film deposition operation in the plasma enhanced CVD process. These particles will deposit on the substrates or the top surface of the film under the deposition process, and may cause defects in the deposited film. The use of a gas gate causes a scavenging gas flow in addition to the material gas flow.

The above-mentioned conventional technologies cannot substantially solve such problems caused by particles depositing on the places other than the exhaust pipes.

In the conventional technologies, exhaust pipes generally have simplified inner shapes, such as cylinders or prisms, to suppress the contact area with exhaust gas, and are heated to prevent adhesion of particles.

Although the technologies can prevent adhesion of particles on the interiors of the exhaust pipes during long, continuous film deposition operations, these cannot prevent adhesion of particles on unheated places, such as pipe walls and vacuum pumps, and portions having complicated shapes, such as exhaust valves. The adhered particles cause malfunction of the valves and other units, and the particles are inevitably scattered into the reaction chambers.

In some technologies, powder traps are provided midway along the exhaust pipes to collect particles or powder in order to prevent adhesion of particles on the unheated places, such as inner walls of the exhaust pipes and vacuum pumps, and on places having complicated shapes, such as exhaust valves; however, the traps will easily clog and clogged powder is difficult to remove. Thus, the evacuation efficiency decreases and life of the pumps is shortened.

SUMMARY OF THE INVENTION

Accordingly, it is an object of the present invention for solving the above-mentioned problems to provide a film deposition apparatus by a plasma enhanced CVD process which can form high-quality deposited films without defects during a long, continuous deposition operation.

It is another object of the present invention to provide a film deposition apparatus by a plasma enhanced CVD process which prevents invasion of powder components contained in the exhaust gas into the succeeding evacuation systems and malfunction of the evacuating systems by clogging, and which can run continuously for a long time.

A film deposition apparatus in accordance with the present invention comprises a vacuum chamber, a gas supplier, a gas exhauster, and a discharging means. The film deposition apparatus forms a deposited film on a substrate provided in the vacuum chamber by a plasma enhanced CVD process, wherein at least one louver is provided at the interior and/or vicinity of the plasma discharging space in the vacuum chamber.

Preferably, the film deposition apparatus is provided with a heater for heating the louver.

Preferably, the structure of the louver enables detachment from the vacuum chamber.

Preferably, the louver has surface unevenness.

Preferably, the louver is provided with openings.

Preferably, louver is connected to an electric field applying means.

BRIEF DESCRIPTION OF THE DRAWINGS

FIG. 4 is a schematic isometric view of an embodiment of a louver used for a film deposition apparatus in accordance with the present invention;

FIG. 5 is a schematic isometric view of another embodiment of a louver used for a film deposition apparatus in accordance with the present invention;

FIGS. 10A to 10C are schematic cross-sectional views illustrating arrangement of louvers used for a film deposition apparatus in accordance with the present invention;

FIGS. 11A to 11C are schematic cross-sectional views illustrating the surface shapes of louvers used for a film deposition apparatus in accordance with the present invention.

DESCRIPTION OF THE PREFERRED EMBODIMENT

Preferred embodiments in accordance with the present invention will now be described with reference to the attached drawings.

Figure 2:
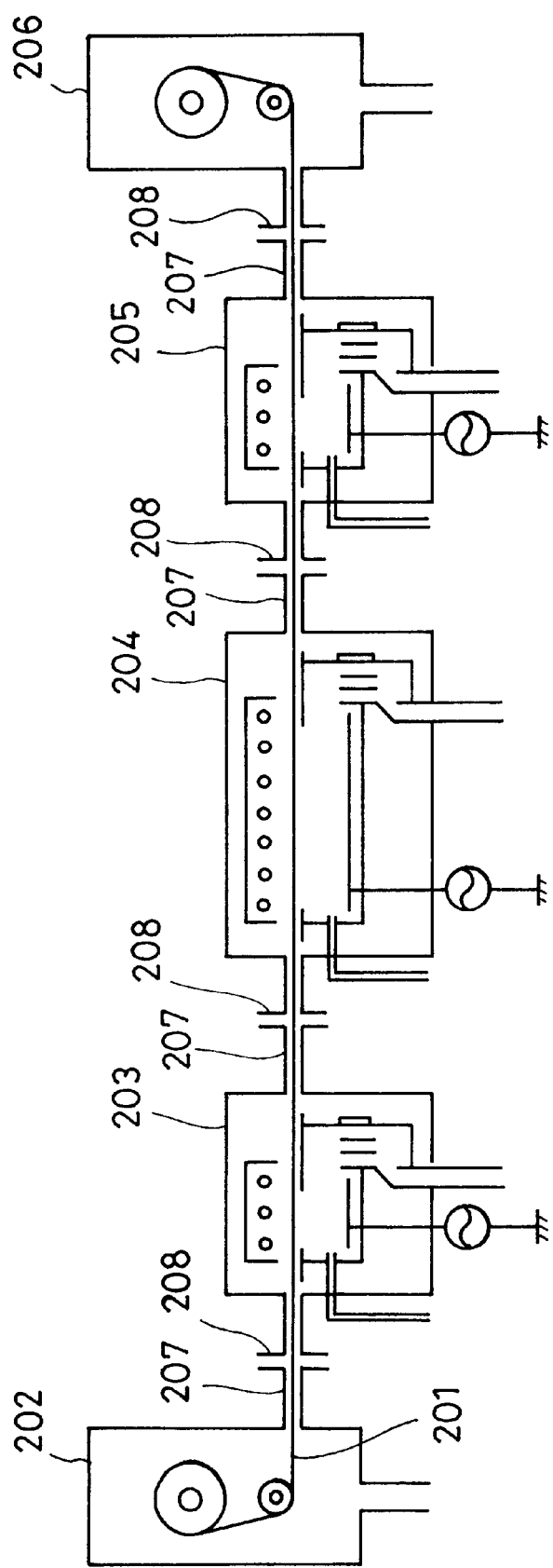
FIG. 2 is a schematic cross-sectional view of an embodiment of a configuration of a roll-to-roll-type film deposition apparatus in accordance with the present invention.

FIG. 2 is a schematic cross-sectional view of an embodiment of a configuration of a roll-to-roll-type film deposition apparatus in accordance with the present invention. A strip of substrate travels through three plasma enhanced CVD chambers by high-frequency glow discharge to continuously form deposited films on the substrate. For example, photovoltaic devices composed of three layers of non-single-crystal silicon semiconductors are continuously produced in such a manner.

In FIG. 2, a strip of long substrate 201 is unwound from an unwinding chamber 202, travels through plasma enhanced CVD chambers 203, 204 and 205 in that order, and is wound in a winding chamber 206 provided with a winding mechanism. The unwinding chamber 202, the plasma enhanced CVD chambers 203, 204 and 205, and the winding chamber 206 are connected to each other by gas gates 207. A gate gas inlet pipe 208 is provided near the center of each gas gate 207. A gas such as $H_2$ or He is supplied from the gate gas 20 inlet pipe 208 to the gas gate 207, and forms a gas flow from the center towards the adjoining chambers. Such a gas flow prevents mixing of material gases in the two adjacent chambers and thus maintains gas purity in each chamber.

Figure 1:
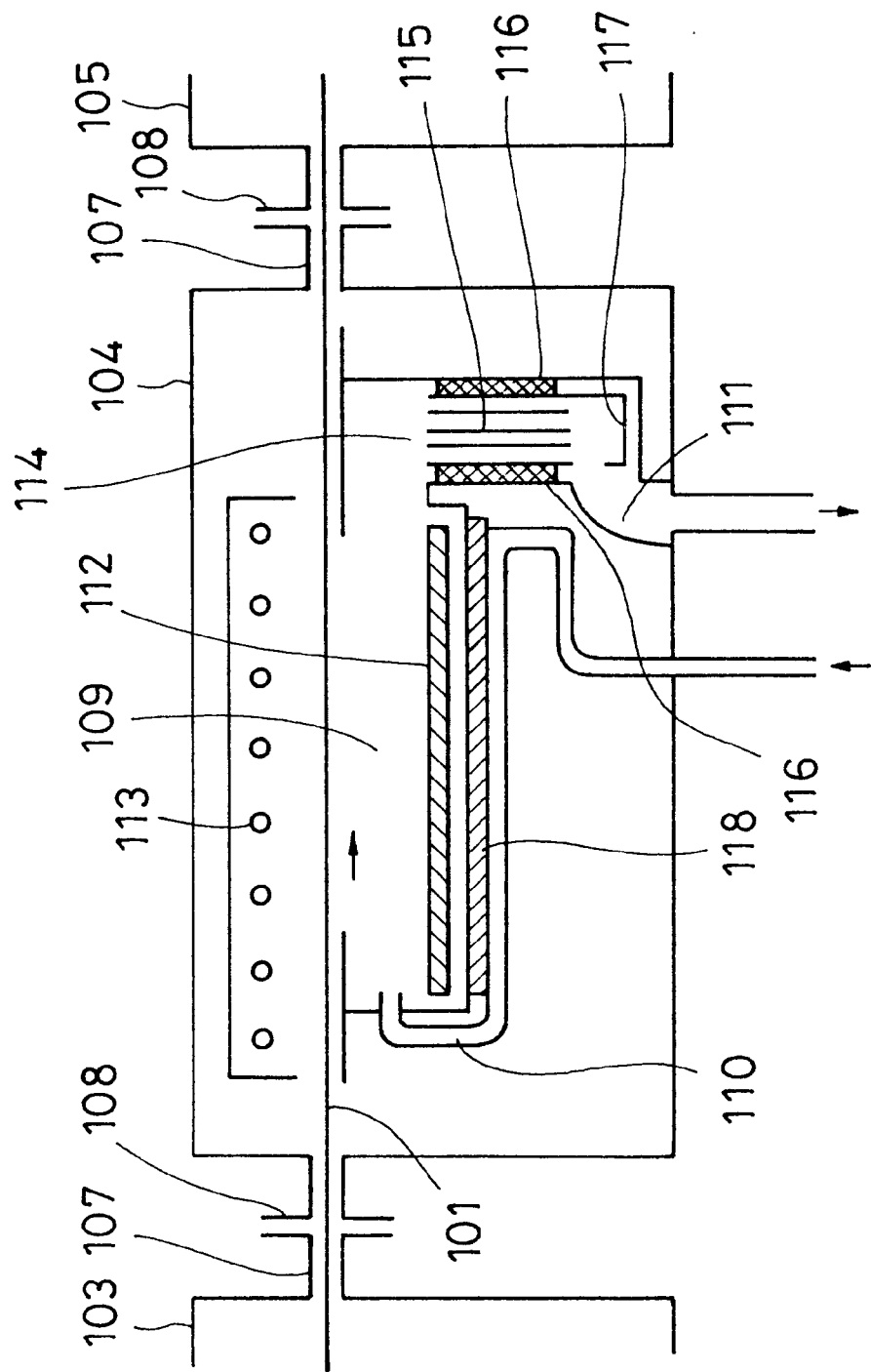
FIG. 1 is a schematic cross-sectional view of a configuration of a plasma enhanced CVD chamber of a film deposition apparatus in accordance with the present invention.

FIG. 1 is an enlarged cross-sectional view of the internal configuration of the plasma enhanced CVD chamber 204 of the film deposition apparatus shown in FIG. 2. Numerals 101 to 108 in FIG. 1 correspond to numerals 201 to 208 in FIG. 2, respectively.

In FIG. 1, a strip of substrate 101 enters a plasma enhanced CVD chamber 104 from a gas gate 107 provided between the plasma enhanced CVD chamber 104 and an upstream plasma enhanced CVD chamber 103, and travels toward the next gas gate 107 provided between the plasma enhanced CVD chamber 104 and a downstream plasma enhanced CVD chamber 105. A plasma discharging space 109 is provided in the plasma enhanced CVD chamber 104, a material gas is supplied to the plasma discharging space 109 through a gas supply pipe 110 and is exhausted through a gas exhaust pipe 111. A high-frequency electrical power is applied to a discharge electrode 112 through a high-frequency power source not shown in the drawing to generate glow discharge and thus gas plasma in the plasma discharging space 109. The gas plasma deposits on a predetermined position of the substrate 101 heated by a heater 113 to form a deposited film. A heater 118 heats the discharging electrode 112 and the gas supply pipe 110. A louver 115 having a high contact area with exhaust gas is provided near a vent 114 of the plasma space 109 and upstream of the gas exhaust pipe 111. A heater 116 heats the louver 115 when the film is deposited on the substrate 101. A trap 117 is provided downstream of the louver 115 to capture exfoliation from the louver.

In the present invention, powder components in the exhaust gas are positively placed in contact with heated members at the interior and/or vicinity of the plasma discharging space, so that the powder components are deposited as a non-scattering film. Since the powder components do not reach the downstream evacuation system, the problems inherent in conventional apparatuses can be solved. The vicinity of the plasma discharging space in the present invention means a region in the reaction chamber adjoining the discharging space. The vicinity of the discharging space includes the vicinity of the vent but does not include the exhaust pipe.

That is, the louver 115 lies at the vicinity of the vent 114 from the plasma discharging space as shown in FIG. 1. The exhaust gas containing powder components from the plasma discharging space 109 comes into contact with the significantly large surface of the louver 115. The flow rate of the exhaust gas is reduced or the contact time is prolonged by such contact when the gas has viscous flow.

The louver 115 may be heated to a high temperature of more than 200° C. by an optional heater 116 so that the powder components in the exhaust gas deposit on the surface of the louver 115 as hard films or hard particles.

As described above, the louver 115 has a large contact area and a large contact time with the exhaust gas, hence the powder components in the exhaust gas are effectively removed regardless of a simple structure not inhibiting the gas flow.

Figure 9:
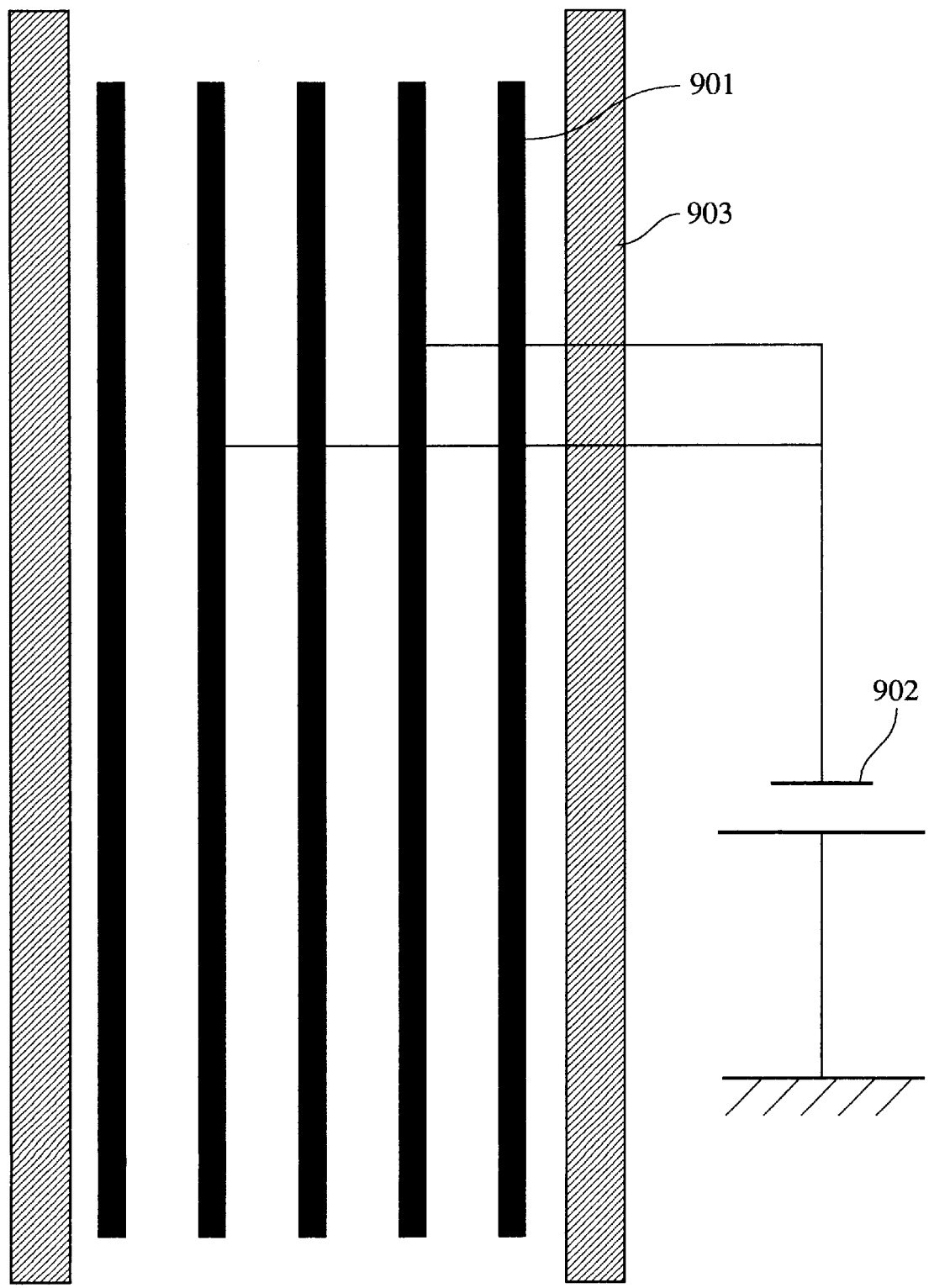
FIG. 9 is a schematic cross-sectional view illustrating application of a voltage to a louver used for a film deposition apparatus in accordance with the present invention.

In the present invention, an electric field may be applied to the louver as shown in FIG. 9 in order to effectively capture gas phase polymerization products such as polysilane $[(SiH_2)_n]$. In the drawing, the louver 901 is supported by a wall 903, and the electric field is applied to several partition walls of the louver 901 through an electric field applying means 902. The residual partition walls of the louver not connected to the electric field applying means 902 and the wall of the plasma enhanced CVD chamber are grounded. In general, polysilane particles are positively charged. Thus, the polysilane particles can be effectively captured by negatively charged partition walls of the louver. Since the films and particles adhered on the louver are hard and not bulky compared with soft particles, these are not scattered on the substrate surface nor do they clog the evacuation paths.

The louver 115 faces the plasma enhanced CVD chamber 104, and is readily detached from the plasma enhanced CVD chamber 104 without disassembling the exhaust pipe 111. Thus, the film fragments and particles adhered on the louver 115 can be easily removed outside the plasma enhanced CVD chamber 104.

The powder components in the exhaust gas are effectively removed to deposit onto the louver at the interior and/or vicinity of the plasma discharging space. Thus, scattering of film fragments and particles is suppressed in these regions. Further, particles substantially do not adhere to the downstream side of the louver.

In the apparatus in accordance with the present invention, it is preferred that a powder trap 117 be provided downstream of the louver 115. When the deposit on the louver becomes thick, parts of the deposit will exfoliate from the louver surface by stress. The exfoliated fragments are collected into the powder trap 117; hence the fragments do not contaminate the evacuation system. It is preferred that the powder trap 117 does not decrease the evacuation efficiency. Thus, the powder trap 117 preferably comprises a catch pan or a rough mesh. Since the powder trap 117 in accordance with the present invention does not use fine filters or adsorbents that have been used in conventional traps, high evacuation efficiency is maintained. It is preferable that the powder trap 117 be also detachable when the louver is detached for cleaning.

Figure 8:
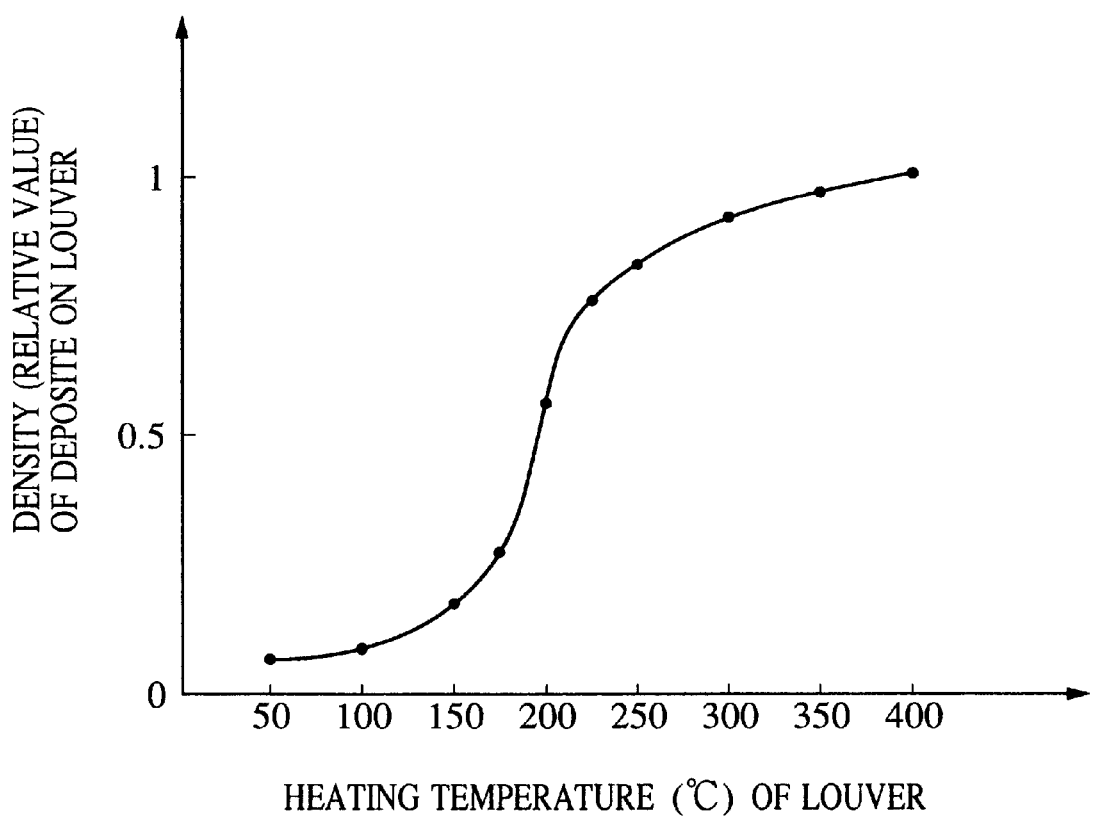
FIG. 8 is a graph illustrating the relationship between the temperature of the louver and the density of the deposit on the louver.

Preferably, the louver is heated to a temperature of higher than approximately 200° C. Such a temperature control is an important factor for hardening of film fragments and particles deposited on the louver. The temperature was determined by the present inventors on the basis of a series of experiments using the film deposition apparatus shown in FIG. 1. In the experiments, various deposited films were formed while changing the temperature of the louver, and the states of the film fragments and particles adhered on the louver were observed. FIG. 8 is a graph illustrating the relationship between the temperature of the louver and the density of the deposit on the louver. In this case, an amorphous Si semiconductor film was deposited on a substrate by a glow discharge plasma enhanced CVD process using a $SiH_4$ material gas. In the graph, the density of the deposit is represented by a relative value when the density at a heating temperature of 400° C. is set to be 1.00.

As shown in FIG. 8, the density of the deposit on the louver steeply increases at a heating temperature of the louver of approximately 200° C. Heating at a temperature higher than 200° C. also causes strong adhesion of the deposit on the louver surface. Thus, the deposit on the louver surface is barely scattered on the substrate surface.

In the film deposition apparatus of the present invention, it is preferable that the louver be cooled to a temperature of less than 150° C. in an oxygen-free atmosphere prior to releasing the vacuum chamber to open air. If the vacuum chamber is released to open air without sufficient cooling the louver for detaching the substrate or cleaning the apparatus, the heated film fragments and particles will be exposed to air.

Since the deposit on the louver has a high density and is barely scattered, the possibility of vigorous reaction with oxygen in air and dust explosion is low compared with low-density or bulky deposits on the unheated members in conventional apparatuses. A minor amount of particles formed in the plasma enhanced CVD space upstream of the louver may deposit on the louver surface.

An amorphous Si film was deposited on a substrate by a plasma enhanced CVD process using a $SiH_4$ material gas in an apparatus shown in FIG. 1 under conditions causing the formation of a large amount of particles composed of hydrated silicone polymers in the plasma space, so that the particles deposited on the louver surface were heated to 300° C. Next, the present inventors studied the oxidation of the deposit on the louver at different louver temperatures when the deposition chamber was released to open air. It was confirmed that release of the vacuum chamber without cooling of the louver to a temperature of lower than 150° C. caused combustion by vigorous reaction of the deposit with oxygen in some cases.

Preferred but non-limiting embodiments of the louver, trap, heater, discharging means, substrate, material gas, and gas target in accordance with the present invention will now be described in detail.

Materials capable of heating to a temperature of higher than 200° C. and depositing particles and film fragments are used without limitation in the present invention. Examples of preferred materials include metals, e.g. stainless steel, aluminum, and iron; and materials with high thermal conductivity, e.g. alumina and graphite.

The louver in the present invention means a structure composed of plates having large surface areas and large contact areas with gas which are arranged such that the plates do not inhibit the gas flow.

Figure 6:
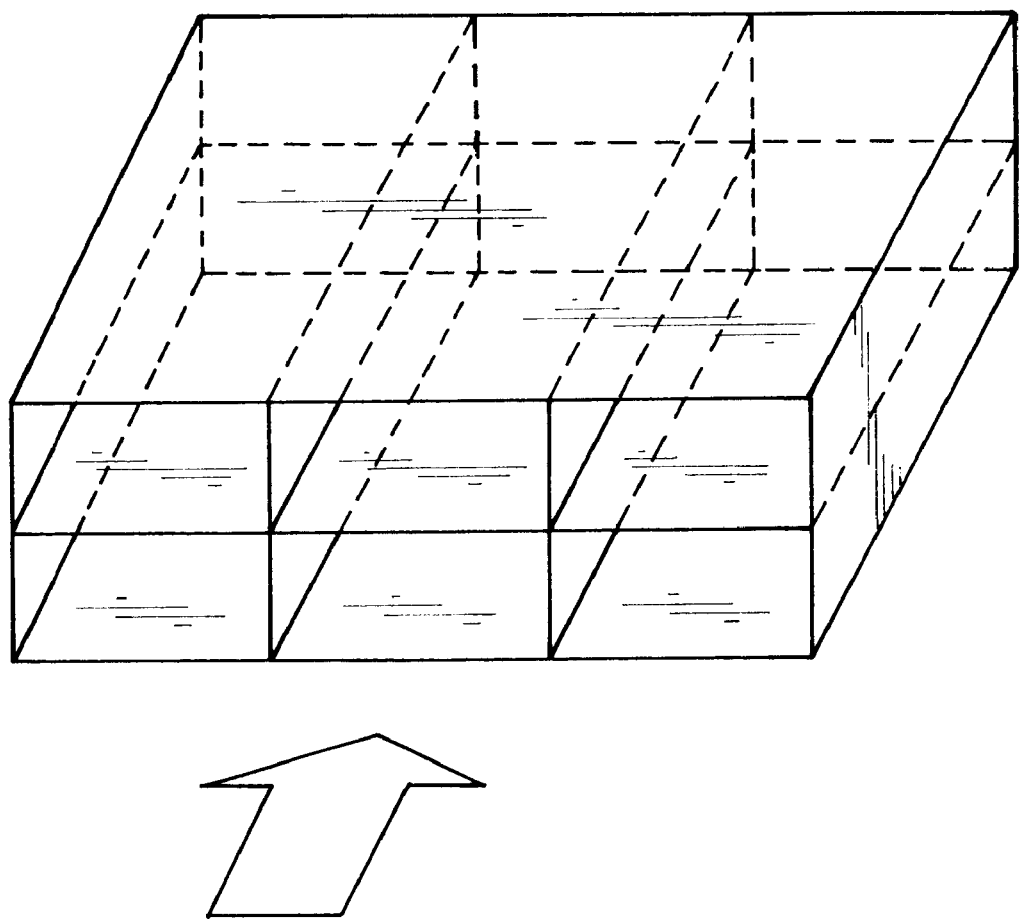
FIG. 6 is a schematic isometric view of a further embodiment of a louver used for a film deposition apparatus in accordance with the present invention.
Figure 7:
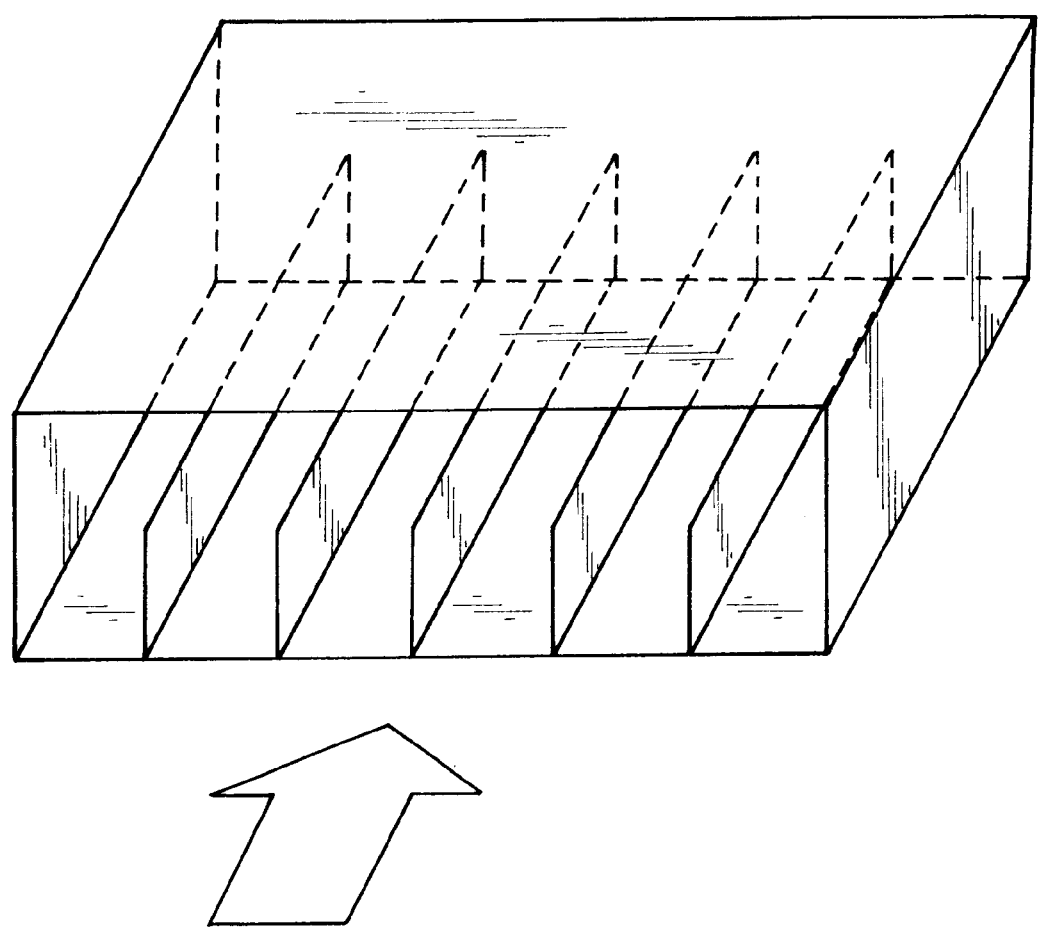
FIG. 7 is a schematic isometric view of a still further embodiment of a louver used for a film deposition apparatus in accordance with the present invention.

FIGS. 4 to 7 and 10A to 10C are preferred configurations of louvers in accordance with the present invention. FIG. 4 shows a louver divided into a plurality of compartments by partition walls parallel to the short side of the rectangular cross-section. FIG. 5 shows a louver divided into a plurality of compartments by partition walls parallel to the long side of the rectangular cross-section. FIG. 6 shows a louver divided into a plurality of compartments by a partition wall unit having a grid cross-section. FIG. 7 shows a louver provided with long fins along the gas stream.

Figure 10A:
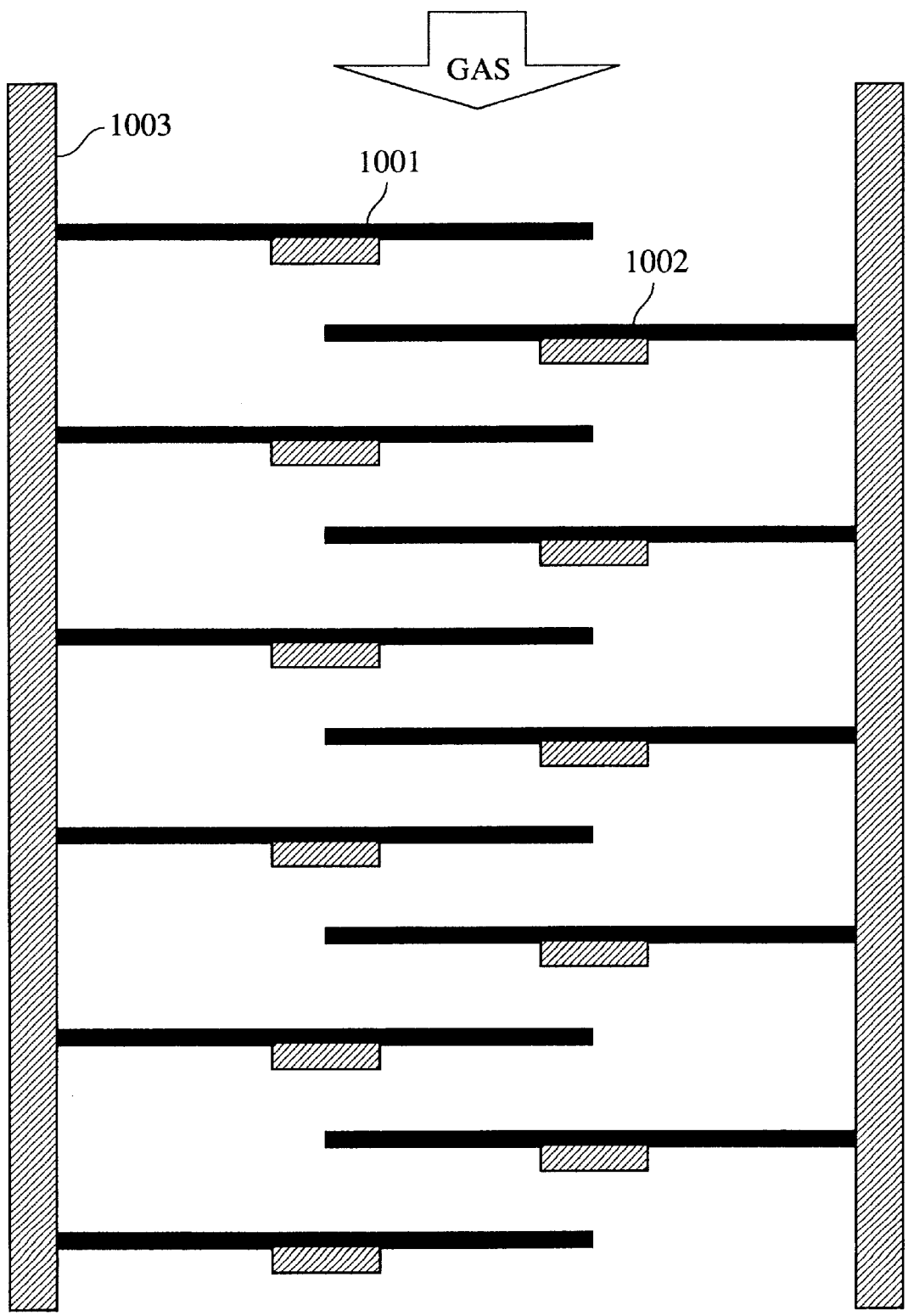
Figure 10B:
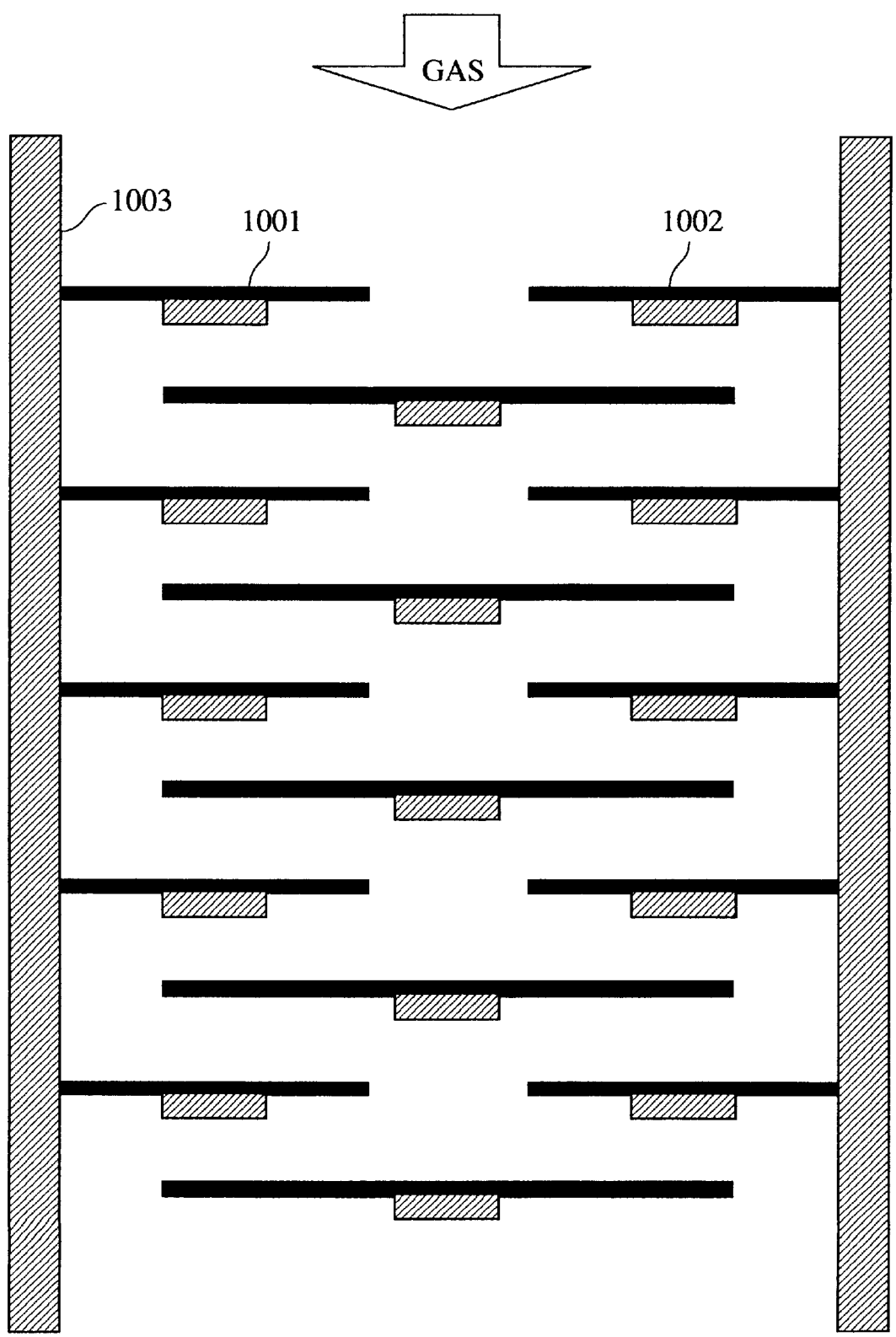

FIG. 10A shows a louver configuration, in which partition walls are alternately attached to two supporting walls and the direction of the partition walls is perpendicular to the gas stream. FIG. 10B shows a louver configuration, in which two partition walls are attached to two supporting walls, respectively, so that an opening is provided between these partition walls, other partition walls are placed in the center of the louver so that openings are provided on the supporting walls, and this arrangement is repeated. In a louver configuration shown in FIG. 10C, some partition walls are arranged upstream of the gas stream based on the configuration shown in FIG. 10B, and other partition walls are arranged parallel to the gas steam.

As shown in FIGS. 4 to 7, partition walls arranged parallel to the gas stream substantially do not inhibit the gas flow. Partition walls may be arranged perpendicular to the gas stream, as shown in FIGS. 10A to 10C. In FIGS. 10A to 10C, numeral 1001 represents a partition wall of the louver, numeral 1002 represents a heater for the louver, and numeral 1003 represents a supporting wall for supporting the partition walls of the louver. Although the heater 1002 is not essential for the present invention, it secures capture and deposition of particles on the louver surfaces.

In the perpendicular arrangement shown in FIGS. 10A to 10C, flowing gas is more effectively placed in contact with the partition walls of the louver; however, a dense arrangement of partition walls may inhibit the gas flow, and thus may decrease the evacuation efficiency. It is preferable for maintaining a high evacuation efficiency that the distance between the partition walls be optimized or that openings are provided in the partition walls of the louver.

Examples of preferred materials for the louver in accordance with the present invention include metals and alloys, e.g. stainless steel, aluminum and its alloys, iron and its alloys, and copper and its alloys; composites of these metals and alloys; and ceramics and glasses, e.g. alumina. Other materials can also be used without limitation. Requirements for the materials include capability of being used in a vacuum atmosphere and sufficiently high strength and durability.

When an electric field is applied to the partition walls of the louver, it is preferred that the louver be composed of a metal material. Insulation materials, such as alumina coated with a conductive film, are also usable.

The thickness of the partition walls of the louver is not limited as long as the louver is not deformed by the stress caused by deposition of particles. It is preferable that the thickness ranges from 1 mm to 10 cm in view of the space efficiency in the louver and the evacuation efficiency.

It is preferable that the structure of the louver enables detachment from the vacuum chamber, so that the louver is readily detached from the vacuum chamber, when the deposit on the louver is removed.

Figure 12A:
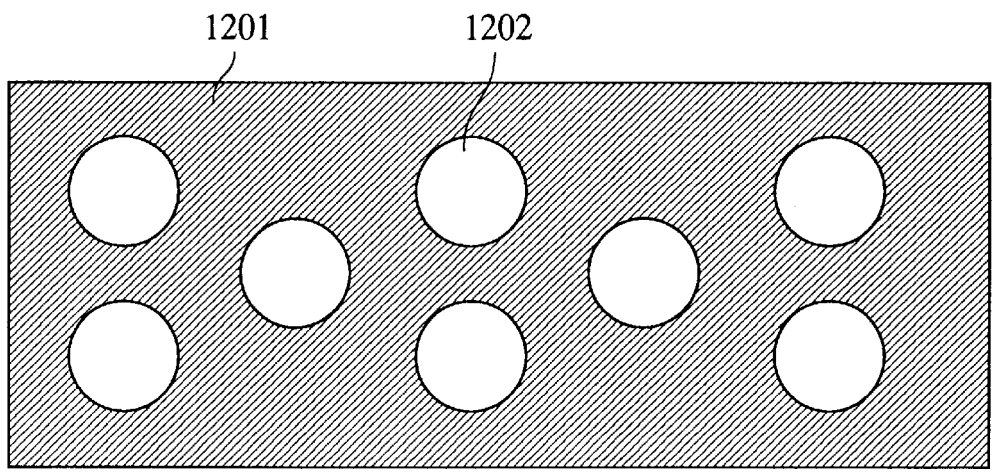
FIGS. 12A to 12C are schematic plan views illustrating the shapes of openings provided in louvers that are used for a film deposition apparatus in accordance with the present invention.
Figure 12B:
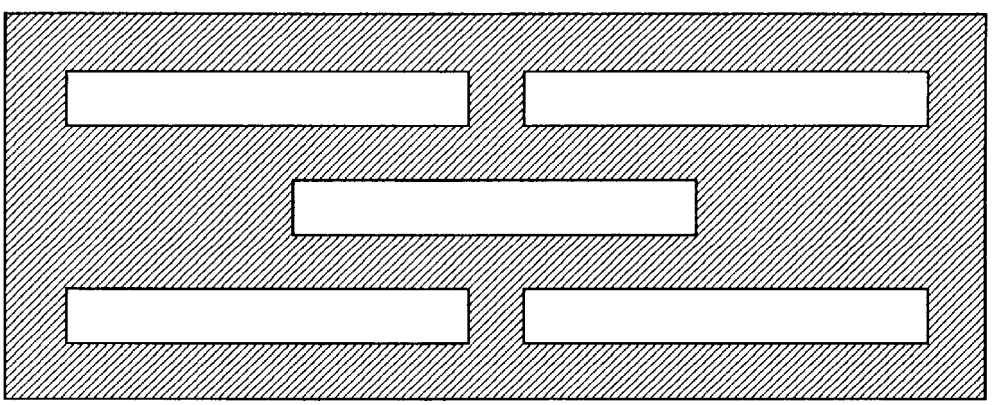
Figure 12C:
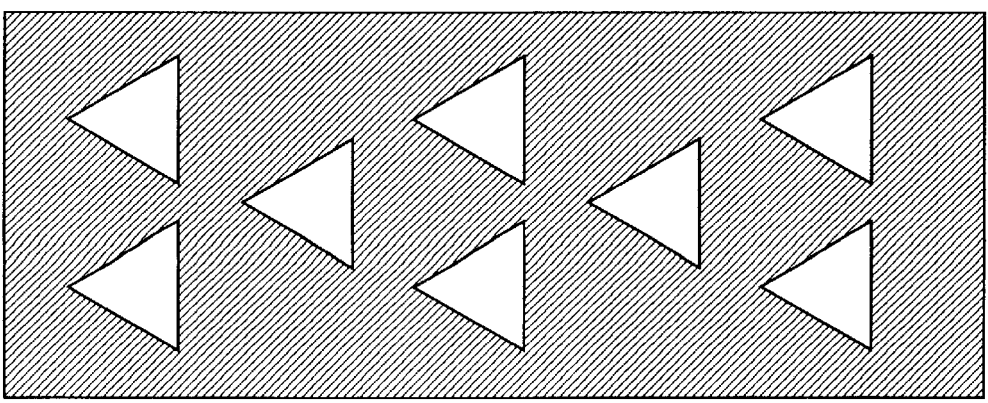

It is preferable that the partition wall surface or the partition wall itself of the louver is modified as shown in FIGS. 11A to 11C and 12A to 12C. FIGS. 11A to 11C are schematic cross-sectional views illustrating the surface shapes of louvers used for a film deposition apparatus in accordance with the present invention. FIGS. 12A to 12C are schematic plan views illustrating the shapes of openings provided on the partition walls of louvers that are used for a film deposition apparatus in accordance with the present invention. In FIGS. 12A to 12C, numeral 1201 represents a partition wall of the louver and numeral 1202 represents an opening.

In such surface modification, random unevenness may be formed on the surface of the partition wall by sand blasting or chemical treatment as shown in FIG. 11A. Alternatively, grooves are formed on the surface by machining, as shown in FIGS. 11B and 11C. Openings may also be formed on the partition walls as shown in FIGS. 12A to 12C. These surface modifications may be used in combination in order to simultaneously achieve an increased contact area with gas and improved adhesiveness of the deposited film fragments and particles.

The size of the unevenness is not limited. The preferred size of the random unevenness shown in FIG. 11A ranges from 1 $\mu$m to 10 mm according to the ten-point average roughness. The height from the bottom to the top of the groove shown in FIG. 11B or 11B preferably ranges from 0.5 mm to 5 cm. Preferably, the width of the top in FIG. 11B ranges from 0.5 mm to 5 cm, and the width of the bottom ranges from 0.5 mm to 5 cm. The cross-section of each groove may be rectangular, triangular, or wavy. The grooves may include one type of cross-section or several types of cross-sections.

Openings can be provided on the partition wall of the louver without limitation, as long as the particles can be effectively captured. Preferably, the area of the openings is 70% or less of the entire partition wall surface. Each opening may have any shape, for example, circular, rectangular, or triangular.

In the present invention, the heater for heating the louver is provided near the louver, that is, at the interior and/or vicinity of the plasma discharging space. Since the long substrate travels in the vacuum chambers during the continuous film deposition operation, it is difficult to fix a heater on the substrate. Thus, the substrate is heated by radiation from a lamp heater or by contact with a heat roller. The heater for heating the louver is different from the heater for heating the substrate, hence its configuration and heating temperature can be independently determined regardless of the substrate temperature. Examples of the heaters for heating the louver include a thermal conductive-type rod or block heater and a radiation-type lamp heater.

Examples of the discharging means in accordance with the present invention, which radiate electromagnetic waves essential for generating plasma discharge, include parallel plate electrodes, rod electrodes, antennas, induction coils, and dielectric windows. Examples of electromagnetic power sources applied to a discharging means for generating plasma include a direct current flow and electromagnetic waves ranging to a microwave region.

When the apparatus in accordance with the present invention has a plurality of plasma enhanced CVD chambers, satisfactory results are achieved by providing a louver in at least one plasma enhanced CVD chamber.

In a plasma enhanced CVD chamber by microwave plasma or ECR plasma, discharge in the discharging chamber is maintained under a low pressure. Such low-pressure discharge can simultaneously achieve a high film deposition rate and suppressed formation of particles. In an apparatus provided with a combination of a microwave plasma enhanced CVD chamber and an RF plasma enhanced CVD chamber, a louver for heating may be provided near the vent of the RF plasma enhanced CVD chamber.

Figure 3:
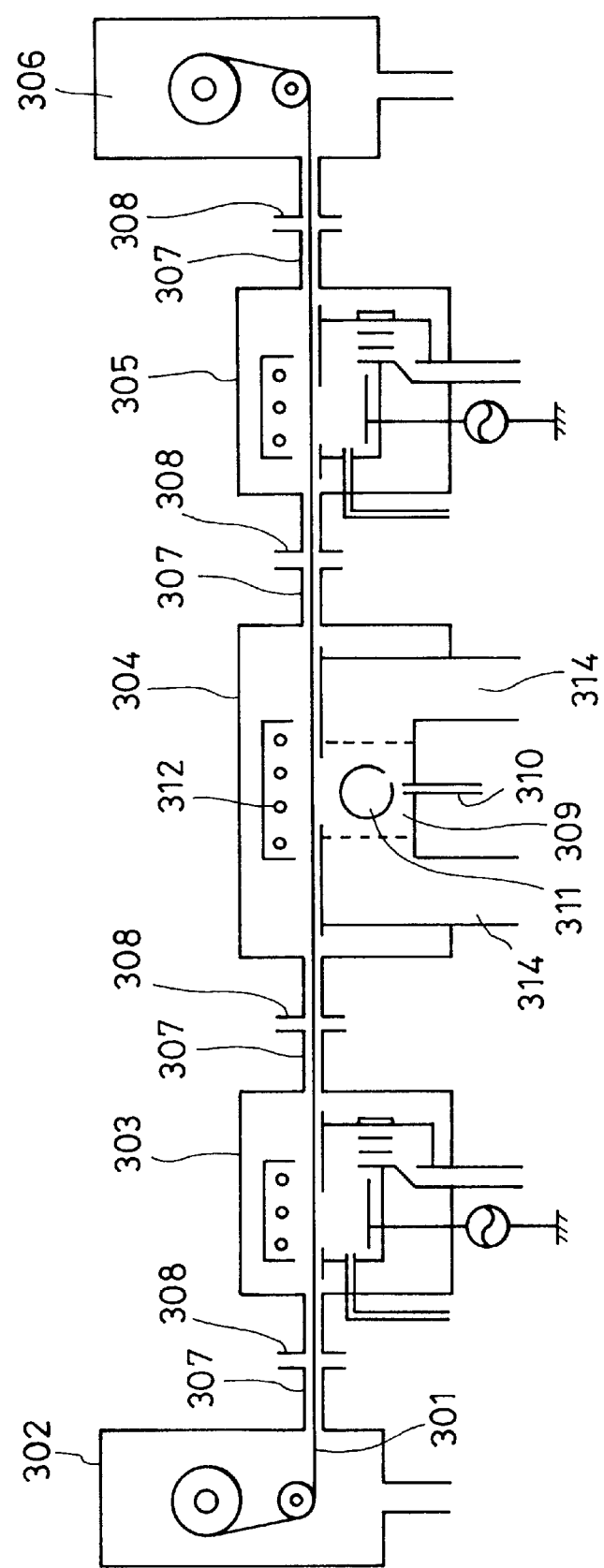
FIG. 3 is a schematic cross-sectional view of another embodiment of a configuration of a roll-to-roll-type film deposition apparatus in accordance with the present invention.

FIG. 3 is a schematic cross-sectional view of another embodiment of the roll-to-roll-type film deposition apparatus in accordance with the present invention. In this embodiment, the second plasma enhanced CVD chamber in the configuration shown in FIG. 1 is changed to a microwave plasma enhanced CVD chamber. This film deposition apparatus is composed of a combination of a microwave plasma enhanced CVD chamber and RF plasma enhanced CVD chambers, and a louver for heating is provided near the vent of the RF plasma enhanced CVD chamber.

Reference numerals 301 to 308 in FIG. 3 correspond to reference numerals 201 to 208 in FIG. 2, respectively. In the plasma enhanced CVD chamber (microwave plasma enhanced CVD chamber) 304 of FIG. 3, a material gas is supplied to a space (plasma discharging space) 309 for depositing films onto a strip of substrate through a gas inlet pipe 310, while a microwave electrical power is supplied through a dielectric window 311 provided on the side face of the discharging chamber to generate glow discharge. A film is deposited on a predetermined position of the substrate 301 heated by a heater 312 to a given temperature. Gas in the space is evacuated from a vent provided on the wall of the plasma discharging space to an exhauster not shown in the drawing through an exhaust pipe.

It is preferred that the substrate used in the apparatus in accordance with the present invention has small deformation and distortion at deposition temperatures of the semiconductor layers, a desired strength, and electrical conductivity. Examples of preferred substrate materials include thin metal films and metal composites composed of stainless steel, aluminum and its alloys, iron and its alloys and copper and its alloys. The surfaces of the metal films and metal composites may be coated with another thin metal film and/or a thin insulating film composed of $SiO_2$, $Si_3N_4$, $Al_2O_3$ or AlN. The insulating film is generally formed by a sputtering process, an evaporation process, or a plating process. An example of another substrate material is a composite composed of a heat resistive resin and a fiber that is coated with an electrically conductive material. Examples of the heat resistive resins include polyimides, polyamides, polyethylene terephthalate, and epoxies. Examples of the fibers include glass fiber, carbon fiber, boron fiber and metal fiber. Examples of the electrically conductive materials include metals, alloys, and transparent conductive oxides (TCOs). The electrically conductive material may be coated onto the composite by a plating process, an evaporation process, a sputtering process or a coating process.

Another metal layer may be provided on the face for forming a semiconductor layer of the conductive substrate for the purpose of improved reflectance of long wavelength light on the substrate, suppressed mutual diffusion between the substrate and the semiconductor layer, improved adhesiveness, and planarized surface. Examples of preferred materials for the metal layer when it is provided as a reflectance layer include Ag, Al, Cu, Al and Si. These metals have high reflectance over a visible to near infrared region.

A transparent conductive layer may be provided on the metal layer to prevent diffusion of the metal components from the metal layer to the semiconductor layer and to improve reflectance. Examples of preferred materials for the transparent conductive layer include transparent conductive oxides, e.g. ZnO, $SnO_2$, $In_2O_3$, and ITO.

The substrate may have a smooth surface or a finely uneven surface. Preferably, the finely uneven surface has a roughness which does not cause semiconductor defects but causes an increase in the optical path of the incident light, because of the light trapping effect.

Preferably, the thickness of the substrate strip is as small as possible in view of material cost and volume reduction, as long as it has a mechanical strength not causing deformation while travelling through the apparatus. The thickness ranges preferably from 0.01 mm to 5 mm, more preferably 0.02 mm to 2 mm, and most preferably 0.05 mm to 1 mm. The width of the substrate strip is determined in consideration of uniformity of plasma in the deposition chambers and the size of the resulting photovoltaic device modules. The width, therefore, ranges preferably from 5 cm to 100 cm, and more preferably 10 cm to 80 cm. The length of the substrate strip is not limited. For example, the substrate strip may have a length corresponding to the winding capacity of the bobbin. Also, long substrate strips may be used after bonding, for example, by welding. The long substrate strip is preferably wound on a bobbin within a range not causing plastic deformation, and loaded into the apparatus in accordance with the present invention.

Material gases fed into the plasma enhanced CVD chambers are selected according to the types of the films deposited on the substrate. When the deposited film is a non-single-crystal silicon semiconductor film, material gases include at least a gaseous compound containing silicon atoms. The material gases may further include a gaseous compound containing germanium atoms, and a gaseous compound containing carbon atoms.

Examples of gaseous compounds containing silicon atoms include linear or cyclic silanes. Examples of such silanes include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, $(SiF_2)_5$, $(SiF_2)_6$, $(SiF_2)_4$, $Si_2F_6$, $Si_3F_8$, $Si_2H_2F_4$, $Si_2H_3F_3$, $SiCl_4$, $(SiCl_2)_5$, $SiBr_4$, $(SiBr_2)_5$, $Si_2Cl_6$ $SiHCl_3$, $SiH_2Br_2$, $SiH_2Cl_2$, and $Si_2Cl_3F_3$, wherein D represents deuterium.

Examples of gaseous compounds containing germanium atoms include $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, and $Ge_2D_6$.

Examples of gaseous compounds containing carbon atoms include $CH_4$, $CD_4$, $C_nH_{2n+2}$, $C_nH_{2n}$, $C_2H_2$, $C_6H_6$, $CO_2$, and CO.

Examples of dopant atoms implanted into a p layer or an n layer for charge control include Group III and V atoms in the periodic table. Examples of starting materials of Group III atoms include boron compounds, e.g. boron hydrides, such as $B_2F_6$, $B_4H_{10}$, $B_5H_9$, $B_5H_{11}$, $B_6H_{10}$, $B_6H_{12}$, and $B_6H_{14}$, and boron halides, such as $BF_3$ and $BCl_3$; and chlorine compounds, such as $AlCl_3$, $GaCl_3$, $InCl_3$, and $TiCl_3$. Among them, $B_2H_6$ and $BF_3$ are preferred.

Examples of starting materials of Group V atoms include phosphorus compounds, e.g. phosphorus hydrides, such as $PH_3$ and $P_2H_4$, and phosphorus halides, such as $PH_4I$, $PF_3$, $PF_5$, $PCl_3$, $PCl_5$, $PBr_3$, $PBr_5$ and $PI_3$; and miscellaneous compounds, such as $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, and $BiBr_3$. Among them, $PH_3$ and $PF_3$ are preferred.

These starting materials of Group III or V atoms are gaseous or can be gasified in the reaction chamber.

The gas compounds or the starting materials of Group III or V atoms may be diluted with gases, such as $H_2$, He, Ne, Ar, Xe and Kr, before introducing them into deposition chambers.

The substrate travels through the vacuum chambers while deposited film is formed on the substrate. When continuously forming a layered film composed of a plurality of deposited films, a roll-to-roll apparatus is preferably used. In such a type of apparatus, gas gates sequentially connect vacuum chambers for forming individual deposited films to each other. Each gas gate forms a slit path, connects the two adjacent glow-discharging chambers and simultaneously separates the chambers from each other. For example, a gas such as $H_2$, Ar, or He is supplied to the gas gate as the separation path to form a gas stream towards the adjoining glow-discharging chambers. The gas stream separates the material gases in these chambers from each other when the substrate strip travels through these chambers.

Thus, the gas gate comprises a slit path and a gas supply means. The inner width of the slit path is slightly wider than the width of the substrate strip. The inner height of the slit path is determined as narrow as possible within a range not causing contact of the substrate surface with the slit. Generally, the inner height ranges from 0.3 mm to 5 mm. The length of the gas gate is determined so as to achieve satisfactory gas separation in view of the pressure differences between the gas gate and the adjoining chambers, the cross-sectional size of the separation path, and the type and flow rate of the gate gas.

The slit path may be preferably provided with a supporting roller for supporting the travelling substrate strip and/or a magnet for stabilizing the position of the substrate in the path if the substrate is magnetic.

It is preferred that the gas supplied to the gas gate does not contain deposited film components such as Si and Ge, and dopant components such as B and P. Examples of preferred gate gases include inert gases, such as He, Ne, Ar, Kr and Xe, dilution gases used in the plasma enhanced CVD chambers, such as $H_2$, and mixtures thereof. Preferably, the gate gas is supplied at the center of the separation path, since significant dislocation of the center causes undesired results.

The present invention will now be described in more detail with reference to the following non-limiting Examples.

EXAMPLE 1

A deposited film for a n-i-p-type solar battery composed of three amorphous silicon layers was formed on a stainless steel substrate using a plasma enhanced CVD apparatus having the configuration shown FIGS. 1 and 2.

Referring to FIG. 2, a stainless steel (SUS 430-BA) substrate 201 with a length of 500 m, a width of 356 mm and a thickness of 0.15 mm was set so that it was unwound from a bobbin in an unwinding chamber 202, passed through plasma enhanced CVD chambers 203, 204, and 205, and wound onto a bobbin in a winding chamber 206. The tension was applied to the substrate by a tension mechanism not shown in the drawing. The vacuum chambers 202 to 206 and the gas gates 202 were evacuated to less than 1 Pa by evacuation systems provided for these vacuum chambers. As shown in FIG. 1, while continuing the evacuation, gaseous helium of 100 sccm was supplied into the plasma enhanced CVD chambers through corresponding gas supply pipes 110 connected to gas supply means (not shown in the drawing). The inner pressure of each vacuum chamber was controlled to 100 Pa by rotating the exhaust valve (not shown in the drawing) of an exhaust pipe 111. Under such conditions, the substrate strip was moved at a rate of 1,200 mm/min. by a substrate transfer mechanism connected to the bobbin in the winding chamber 206, as shown in FIG. 2.

Referring now to FIG. 1, the substrate strip 101 was heated to a given temperature in each plasma enhanced CVD chamber by a substrate heater 113 and a temperature monitor (not shown in the drawing) provided in the chamber. A metal louver 115 provided at the vicinity of a vent 114 in the exhaust pipe 111 was heated to 300° C. by a heater 110 being in contact with the louver 115. The louver 115 had a plurality of compartments divided by partition walls parallel to the short side of the rectangular cross-section as shown in FIG. 4.

After the substrate 101 was uniformly heated in each plasma enhanced CVD chamber, heating of the substrate was continued while the gas supplied through the gas supply pipe 110 was changed from helium to a material gas containing $SiH_4$. Gaseous hydrogen of 1,000 sccm was supplied for separating the material gases in the two adjacent plasma enhanced CVD chambers through a gate gas inlet pipe 108 connected to a gas supply means not shown in the drawing.

High-frequency electrical power was supplied to a discharging electrode 112 in each plasma enhanced CVD chamber through a high-frequency power source not shown in the drawing to continuously generate discharge in the plasma enhanced CVD chamber. A layered film composed of non-single-crystal silicon layers was continuously formed on the travelling substrate strip 101 by means of the material gas decomposed by the plasma. Table 1 shows film deposition conditions in the plasma enhanced CVD chambers.

TABLE 1

| | Glow discharge chamber 203 | Glow discharge chamber 204 | Glow discharge chamber 205 |
|---|---|---|---|
| Type & thickness of deposited film | n-type non-single-crystal Si: 30 nm | i-type non-single-crystal Si: 200 nm | p-type non-single-crystal Si: 10 nm |
| Deposition process | High-frequency (13.56 MHz) plasma enhanced CVD process | | |
| Material gas and flow rate | $SiH_4$: 200 sccm $H_2$: 2,000 sccm $PH_3$: 10 sccm | $SiH_4$: 1,000 sccm $H_2$: 8,000 sccm | $SiH_4$: 20 sccm $H_2$: 2,000 sccm $BF_3$: 1 sccm |
| Substrate temp. | 300° C. | 250° C. | 250° C. |
| Pressure | 133 Pa | 133 Pa | 133 Pa |
| Electrical power | 200 W | 2,000 W | 1,500 W |

Film deposition was performed on the substrate over approximately 400 m, and then the power and gas supply and heating of the substrate were stopped. The chambers were purged and sufficiently cooled together with the substrate. The apparatus was released to open air and the substrate having the deposited film was removed from the bobbin in the winding chamber. The temperature of the louver when the apparatus was released was 100° C.

The substrate strip was used for continuous production of square n-i-p-type single solar battery modules with a side of 35 cm using a modularizing apparatus. A thin ITO film with a thickness of 60 nm was deposited to form a transparent electrode on the layered semiconductor film, and slit silver electrodes as collecting electrodes were formed with a given distance. The resulting solar batteries were irradiated with artificial solar light of AM 1.5 (100 mW/cm$^2$) for evaluating the photovoltaic characteristics.

The rate of short-circuiting due to defects caused by inclusion of fine particles in the deposited film was approximately 2% in the initial 100-m section and the final 100-m section. The results suggest that the rate of short-circuiting caused by fine particles was maintained at a low level during the continuous film deposition process. Here, the short-circuiting was judged when the release voltage of the tested device decreased by 10% or more from the release voltage of a device having no defect. For example, when the device having no defect had a release voltage of 1.00 V, a device having a release voltage of 0.90 V or less was judged as the short-circuiting.

Although hard films were deposited on the louver surface in each plasma enhanced CVD chamber, a substantial amount of particles was not found. Combustion of the films deposited on the louver did not occur when the chamber was released to open air.

For comparison, solar battery modules were continuously manufactured using the same apparatus, except that the louver 115 was removed from the system and the heater 116 was not used. The rate of short-circuiting due to inclusion of fine particles in the film was approximately 3% in the initial 100-m section, and approximately 15% in the final 100-m section. The results suggest that the continuous operation of the apparatus without the louver causes a steep increase in short-circuiting defects. Large amounts of soft, low-density particles deposited near the vent in the plasma enhanced CVD chamber and in the exhaust pipe.

EXAMPLE 2

Square n-i-p-type single solar battery modules with a side of 35 cm were formed on the substrate strip over 400 m as in Example 1, except that the heating temperature of the louver was 220° C. at the film deposition step and 130° C. at the releasing step. The resulting solar batteries were irradiated with artificial solar light of AM 1.5 (100 mW/cm$^2$) for evaluating the photovoltaic characteristics, as in Example 1.

The rate of short-circuiting due to defects caused by inclusion of fine particles in the deposited film was approximately 3% in the initial 100-m section and approximately 4% in the final 100-m section. The results suggest that the rate of short-circuiting caused by fine particles slightly increased during the continuous film deposition process. Although hard films were deposited on the louver surface in each plasma enhanced CVD chamber, a substantial amount of particles was not found.

EXAMPLE 3

Square n-i-p-type single solar battery modules with a side of 35 cm were formed on the substrate strip over 400 m as in Example 1, except that a louver having a shape shown in FIG. 7 was used. The resulting solar batteries were irradiated with artificial solar light of AM 1.5 (100 mW/cm$^2$) for evaluating the photovoltaic characteristics, as in Example 1.

The rate of short-circuiting due to defects caused by inclusion of fine particles in the deposited film was approximately 2% in the initial 100-m section and approximately 3% in the final 100-m section. The results suggest that the rate of short-circuiting caused by fine particles slightly increased during the continuous film deposition process. Although hard films were deposited on the louver surface in each plasma enhanced CVD chamber, a substantial amount of particles was not found.

EXAMPLE 4

Cubic nip-type single solar battery modules with a side of 35 cm were formed on the substrate strip over 400 m as in Example 1, except that the structure of the glow discharge chamber is changed from that shown in FIG. 2 to that shown in FIG. 3, the second chamber was replaced with a microwave As enhanced CVD chamber and no heated louver was provided near the vent. Table 2 shows film deposition conditions in the glow discharge enhanced CVD chambers.

TABLE 2

|  | Glow discharge chamber 303 | Glow discharge chamber 304 | Glow discharge chamber 305 |
| --- | --- | --- | --- |
| Type & thickness of deposited film | n-type non-single-crystal Si: 30 nm | i-type non-single-crystal Si: 150 nm | p-type non-single-crystal Si: 10 nm |
| Deposition process | High-frequency (13.56 MHz) plasma enhanced CVD process | Microwave (2.45 GHz) plasma enhanced CVD process | High-frequency (13.56 MHz) plasma enhanced CVD process |
| Material gas and flow rate | SiH$_4$: 200 sccm H$_2$: 2,000 sccm PH$_3$: 10 sccm | SiH$_4$: 200 sccm GeH$_4$: 200 sccm H$_2$: 1,200 sccm | SiH$_4$: 20 sccm H$_2$: 2,000 sccm BF$_3$: 1 sccm |
| Substrate temp. | 300° C. | 300° C. | 250° C. |
| Pressure | 133 Pa | 1 Pa | 133 Pa |
| Electrical power | 200 W | 600 W | 1,500 W |

The resulting solar batteries were irradiated with artificial solar light of AM 1.5 (100 mW/cm$^2$) for evaluating the photovoltaic characteristics, as in Example 1. The rate of short-circuiting due to defects caused by inclusion of fine particles in the deposited film was approximately 3% in the initial 100-m section and in the final 100-m section. The results suggest that the rate of short-circuiting caused by fine particles does not change during the continuous film deposition process. Although hard films were deposited on the louver surface in each plasma enhanced CVD chamber, a substantial amount of particles was not found.

EXAMPLE 5

Cubic n-i-p-type single solar battery modules with a side of 35 cm were formed on the substrate strip over 400 m as in Example 1, except that the louvers having the surface shown in FIGS. 11A to 11C were used. The louver shown in FIG. 11A had a ten-point average roughness of 1 mm, the louver surface shown in FIG. 11B had a height of 1 cm, a top width of 2 mm and a bottom width of 1 cm, and the louver surface shown in FIG. 11C had a height of 1 cm and a peak-to-peak distance of 1 cm.

The resulting solar batteries were irradiated with artificial solar light of AM 1.5 (100 mW/cm$^2$) for evaluating the photovoltaic characteristics, as in Example 1. The average rate of short-circuiting due to defects caused by inclusion of fine particles in the deposited film was approximately 1.8% in the initial 100-m section and approximately 2.5% in the final 100-m section. The results suggest that the rate of short-circuiting caused by fine particles slightly increased during the continuous film deposition process. Although hard films were deposited on the louver surface in each plasma enhanced CVD chamber, a substantial amount of particles was not found.

EXAMPLE 6

Cubic n-i-p-type single solar battery modules with a side of 35 cm were formed on the substrate strip over 400 m as in Example 1, except that the louvers having the openings shown in FIGS. 12A to 12C were used. The louver shown in FIG. 12A had eight circular openings with diameters of 3 cm, the louver shown in FIG. 12B had five oblong openings with lengths of 7 cm and widths of 2 cm, and the louver shown in FIG. 12C had eight triangular openings with sides of 3 cm.

The resulting solar batteries were irradiated with artificial solar light of AM 1.5 (100 mW/cm$^2$) for evaluating the photovoltaic characteristics, as in Example 1. The average rate of short-circuiting due to defects caused by inclusion of fine particles in the deposited film was approximately 1.8% in the initial 100-m section and approximately 2.5% in the final 100-m section. The results suggest that the rate of short-circuiting caused by fine particles slightly increased during the continuous film deposition process. Although hard films were deposited on the louver surface in each plasma enhanced CVD chamber, a substantial amount of particles was not found.

EXAMPLE 7

Cubic n-i-p-type single solar battery modules with a side of 35 cm were formed on the substrate strip over 400 m as in Example 1, except that every second partition wall of the louver was connected to an electric field applying means to apply a voltage of −100 V. The resulting solar batteries were irradiated with artificial solar light of AM 1.5 (100 mW/cm$^2$) for evaluating the photovoltaic characteristics, as in Example 1. The average rate of short-circuiting due to defects caused by inclusion of fine particles in the deposited film was approximately 1.7% in the initial 100-m section and approximately 2.4% in the final 100-m section. The results suggest that the rate of short-circuiting caused by fine particles slightly increased during the continuous film deposition process. Although hard films were deposited on the louver surface in each plasma enhanced CVD chamber, a substantial amount of particles was not found.

As described above, the film deposition apparatus in accordance with the present invention is provided with a louver at the interior and/or vicinity of the plasma discharging space, and film fragments and particles or powder contained in the gas adhere onto the louver. Since scattering of the film fragments and particles is suppressed during a long term, continuous film deposition operation, a high-quality film without defects is continuously formed on a long substrate.

Further, the louver prevents adhesion of the film fragments and particles on the evacuation system downstream of the louver, hence the evacuation system is not clogged with fine particles, and the plasma enhanced CVD apparatus can be continuously operated for a long time.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A film deposition apparatus comprising a vacuum chamber, a gas supplier, a gas exhauster, and a plasma discharging means, said film deposition apparatus forming a deposited film on a substrate provided in said vacuum chamber by a plasma enhanced CVD process, wherein at least one louver is provided in the vacuum chamber adjacent to the location where plasma is generated in the vacuum chamber, said louver being positioned so that it does not participate in deposition of film on the substrate, and wherein a trap is provided under the louver.

2. A film deposition apparatus according to claim 1, wherein said film deposition apparatus is provided with a heater for heating said louver.

3. A film deposition apparatus according to claim 1, wherein the structure of said louver enables detachment from said vacuum chamber.

4. A film deposition apparatus according to claim 1, wherein said louver has surface unevenness.

5. A film deposition apparatus according to claim 1, wherein said louver is provided with openings.

6. A film deposition apparatus according to claim 1, wherein said louver is connected to an electric field applying means.

* * * * *

UNITED STATES PATENT AND TRADEMARK OFFICE
CERTIFICATE OF CORRECTION

PATENT NO. : 6,223,684 B1
DATED : May 1, 2001
INVENTOR(S) : Yasushi Fujioka et al.

It is certified that error appears in the above-identified patent and that said Letters Patent is hereby corrected as shown below:

Column 14,
Line 9, "nip-type" should read -- n-i-p-type --; and
Line 14, "As" should be deleted.

Signed and Sealed this

Twelfth Day of March, 2002

Attest:

Attesting Officer

JAMES E. ROGAN
Director of the United States Patent and Trademark Office